(12) United States Patent
Larkin

(10) Patent No.: US 9,620,885 B2
(45) Date of Patent: Apr. 11, 2017

(54) INSULATED TEST CLIP COVER ASSEMBLY

(71) Applicant: WESTEK ELECTRONICS, INC., Watsonville, CA (US)

(72) Inventor: Kevin B. Larkin, Pebble Beach, CA (US)

(73) Assignee: Westek Electronics, Inc., Watsonville, CA (US)

( * ) Notice: Subject to any disclaimer, the term of this patent is extended or adjusted under 35 U.S.C. 154(b) by 272 days.

(21) Appl. No.: 14/035,858

(22) Filed: Sep. 24, 2013

(65) Prior Publication Data

US 2014/0117976 A1    May 1, 2014

Related U.S. Application Data

(60) Provisional application No. 61/705,111, filed on Sep. 24, 2012.

(51) Int. Cl.
| | |
|---|---|
| *G01R 1/06* | (2006.01) |
| *H01R 13/447* | (2006.01) |
| *B23P 5/00* | (2006.01) |
| *H01B 1/00* | (2006.01) |
| *H01R 11/24* | (2006.01) |
| *H01R 101/00* | (2006.01) |
| *G01R 1/067* | (2006.01) |
| *G01R 1/04* | (2006.01) |

(52) U.S. Cl.
CPC .............. *H01R 13/447* (2013.01); *B23P 5/00* (2013.01); *B23P 2700/00* (2013.01); *G01R 1/0425* (2013.01); *G01R 1/06788* (2013.01); *H01B 1/00* (2013.01); *H01R 11/24* (2013.01); *H01R 2101/00* (2013.01)

(58) Field of Classification Search
CPC ........... B23P 5/00; B23P 2700/00; H01B 1/00
See application file for complete search history.

(56) References Cited

U.S. PATENT DOCUMENTS

| | | | |
|---|---|---|---|
| 2,522,810 A | 9/1950 | Bailey | |
| 2,754,490 A * | 7/1956 | Schnoll | ................. H01R 11/24 439/729 |
| 2,758,947 A | 8/1956 | Feighner | |
| 2,846,658 A * | 8/1958 | Bender | ......................... 439/891 |
| 2,851,672 A | 9/1958 | Odenwald | |
| 4,768,972 A * | 9/1988 | Ignasiak | .............. G01R 1/0425 439/330 |
| 5,088,930 A * | 2/1992 | Murphy | ............ H01L 21/67121 439/330 |

(Continued)

*Primary Examiner* — Jermele M Hollington
*Assistant Examiner* — Temilade Rhodes-Vivour

(57) ABSTRACT

An insulator for a test clip is described. The insulator includes a first clip cover configured to removably attach to a top portion of a test clip. The test clip comprises a top portion and a bottom portion pivotally attached to the top portion along a pivot axis. The insulator also comprises a second clip cover configured to removably attach to the bottom portion of the test clip. Each of the first and the second clip cover comprises one or more retaining elements configured to secure the clip cover to its respective portion of the test clip. In some implementations, each of the first and the second clip cover comprises one or more cantilevered retaining segments configured to extend over a portion of the test clip in order to secure the first and the second clip covers to the test clip.

17 Claims, 8 Drawing Sheets

(56) References Cited

U.S. PATENT DOCUMENTS

| | | | | |
|---|---|---|---|---|
| 5,928,022 A * | 7/1999 | Moeller | ............ | G01R 1/06788 439/197 |
| 6,139,555 A * | 10/2000 | Hart | ................ | A61B 17/1285 606/139 |
| 6,276,956 B1 * | 8/2001 | Cook | ................ | H01R 11/18 324/72.5 |
| 7,214,107 B2 * | 5/2007 | Powell et al. | ............... | 439/729 |
| 7,422,474 B1 * | 9/2008 | Good | ............... | 439/504 |

* cited by examiner

INSULATED TEST CLIP COVER ASSEMBLY

CROSS-REFERENCE TO RELATED APPLICATION

This application claims priority to U.S. provisional patent application Ser. No. 61/705,111, entitled "Insulated Test Clip Cover Assembly," filed Sep. 24, 2012, which is incorporated by reference in its entirety.

TECHNICAL FIELD

The disclosed implementations relate generally to covers for clips, and in particular, insulating covers for electrical and/or telecommunication test clips.

BACKGROUND

Test clips, also known as alligator clips, crocodile clips, or spring clips, are often used to connect test equipment, such as voltmeters, lineman's handsets (also known as "butt sets" or "test sets"), and the like, to electrical or telecom equipment. In such circumstances, it is beneficial to electrically insulate the test clips. Such insulation may be used, for example, to avoid introducing electrical disturbances into the circuits being tested, and/or to prevent a user from receiving an electrical shock while handling the clips. For example, test clips may be substantially covered by an insulating sheath or boot. However, such test clip insulators are inconvenient, as they can make opening and closing the clip difficult and can limit the effective length of the jaws of the clip. Even if such insulators are reduced in size to avoid restricting access to the jaws of the clip, portions of the clip may be left without insulation, reducing the effectiveness of the insulator.

SUMMARY

In some implementations, a test clip insulator includes a first clip cover configured to removably attach to a top portion of a test clip, wherein the test clip comprises a top portion and a bottom portion pivotally attached to the top portion along a pivot axis. the test clip insulator also includes a second clip cover configured to removably attach to the bottom portion of the test clip. Each of the first and the second clip cover includes one or more retaining elements configured to secure the clip cover to its respective portion of the test clip.

In some implementations, the test clip insulator is not coupled to a test clip. In such cases, the test clip insulator may be provided as an aftermarket or retrofit clip insulator that may be attached to a user's existing test clips. On the other hand, in some implementations, the test clip is coupled (e.g., removably coupled) to a test clip, and may be provided as a complete insulated test clip assembly.

BRIEF DESCRIPTION OF THE DRAWINGS

The implementations disclosed herein are illustrated by way of example, and not by way of limitation, in the figures of the accompanying drawings.

DETAILED DESCRIPTION

Figure 1:
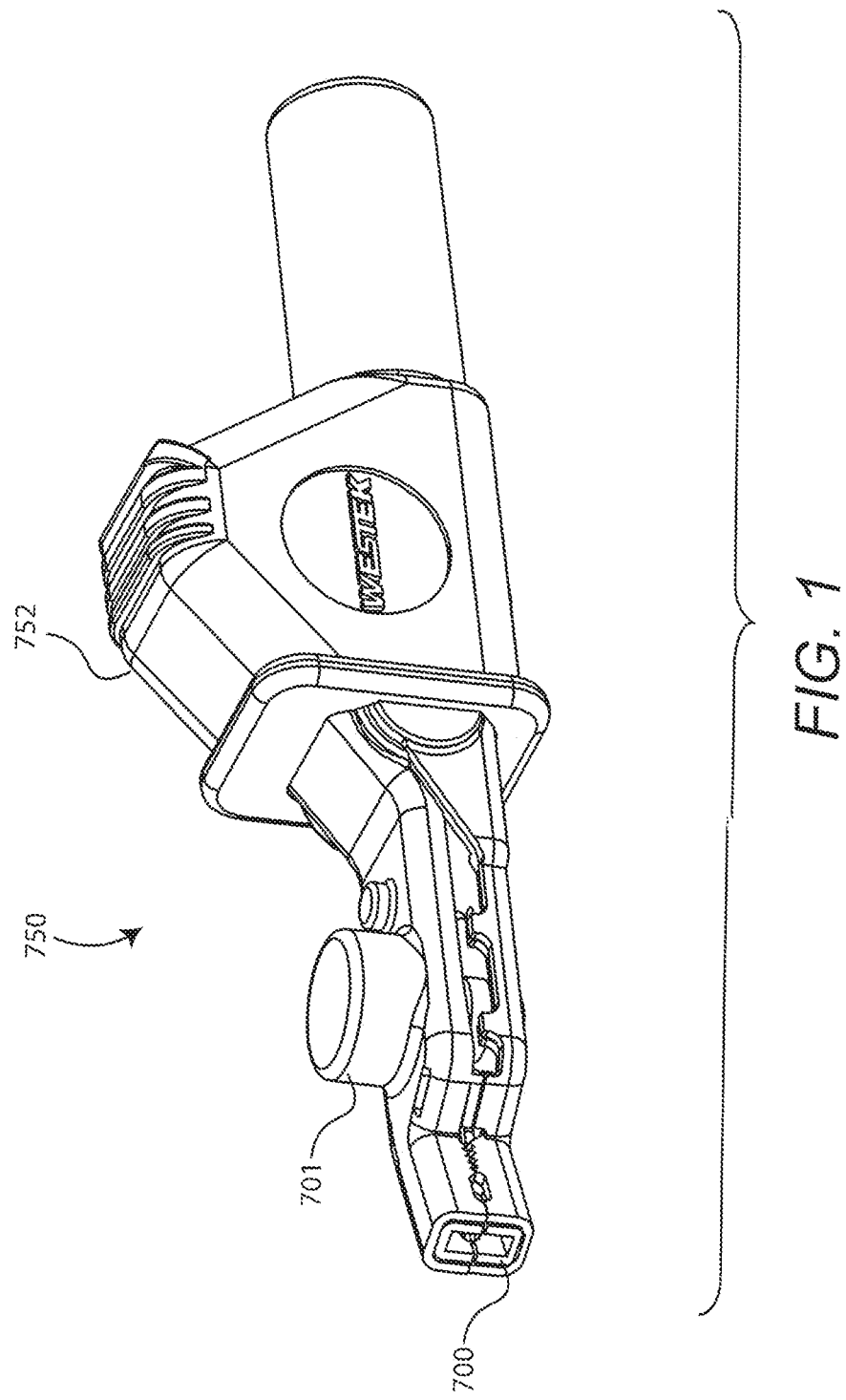
FIG. 1 is a perspective view of an insulated test clip assembly, in accordance with some implementations.

Some implementations disclosed herein provide an insulated cover assembly for use with various types of clips, such as test clips for electronic or telecommunications testing equipment, (e.g., alligator clips, crocodile clips, spring clips, etc.), or any other clips for which an insulated cover may be useful (e.g., jumper cables, etc.). While the present application describes an insulated cover assembly with reference to "test clips," the same principles apply to other types of clips as well. The use of the term "test clip" refers to one exemplary type of clip, and is not intended to limit the disclosed ideas to any particular type, size, or configuration of clip, nor to any particular use to which clips may be put.

In some implementations, the insulated cover is configured to cover both the jaws and the grip portion of the test clip (i.e., the part of the clip that a user grasps in order to manipulate the clip and/or open the jaws). For example, the insulated test clip assembly (or insulated cover assembly) is configured to substantially cover the outer surfaces of the test clip in order to ensure that the test clip will not cause electrical shorts, arcs, or other electrical disturbances if the test clip comes in contact with other test clips, grounds, or other conductive components. Accordingly, in some implementations, at least portions of the insulated cover assembly are composed of a non-conductive material, such as a non-conductive plastic, rubber, or any other suitable material. Moreover, the insulated test clip cover protects users from potential contact with live electrical components, reducing the risk of electrocution or other potential problems. The insulated cover assembly also helps ruggedize the test clip, protecting it from impacts and other abuse, as well as reducing exposure to contaminants, such as moisture.

In some implementations, the insulated cover assembly can be snapped, clipped, or otherwise secured on to the test clip, such that it is removably attached to the test clip. Thus, instead of a permanent attachment, such as permanently molding an insulating material over an alligator clip, or riveting an insulating cover to an alligator clip (e.g., with a metal rivet or a plastic weld), some implementations of the presently disclosed insulated cover assembly can be easily clipped to the test clip by hand and without additional tools or large-scale manufacturing techniques or processes. Moreover, the clip cover assembly can be easily removed if it were to break, or if it is inconvenient for a particular environment (e.g., too large for a testing space), or if it otherwise needs to be removed or replaced. And if the insulated cover assembly is removed, it can easily be re-attached to the test clip. On the other hand, if insulating material were to be permanently attached to a test clip, separation of the insulation from the clip would not be easily repairable, as the entire component would likely have to be replaced with a new test clip. This would require removal of the broken test clip from a testing lead and re-attachment of a new assembly, including re-terminating the test clip to the test lead. This is cumbersome and expensive. Because the disclosed insulating cover assembly is removably attached to the test clip, however, the inconvenience and expense associated with test clips with permanently attached insulators can be avoided.

Moreover, because the insulated cover assembly can be snapped, clipped, or otherwise secured to the test clip itself (e.g., rather than simply forming an insulating sheath around the test clip without snapping the insulating material to individual portions of the test clip), the overall assembly is more sturdy and rigid, and is less likely to come apart or otherwise detach from the test clip.

In some implementations, various versions of the insulating cover assembly are designed so as to couple to various existing test clip designs. Accordingly, the insulating cover assembly can be provided as a retrofit insulating kit for existing test clips of various makes, models, designs, and/or standards.

An exemplary insulated test clip and/or test clip assembly is now described with reference to the figures.

FIG. 1 is a perspective view of an insulated test clip assembly 750, in accordance with some implementations. The insulated test clip assembly 750 includes a test clip 700, an insulated cover assembly 701, and a boot 752.

Figure 2:
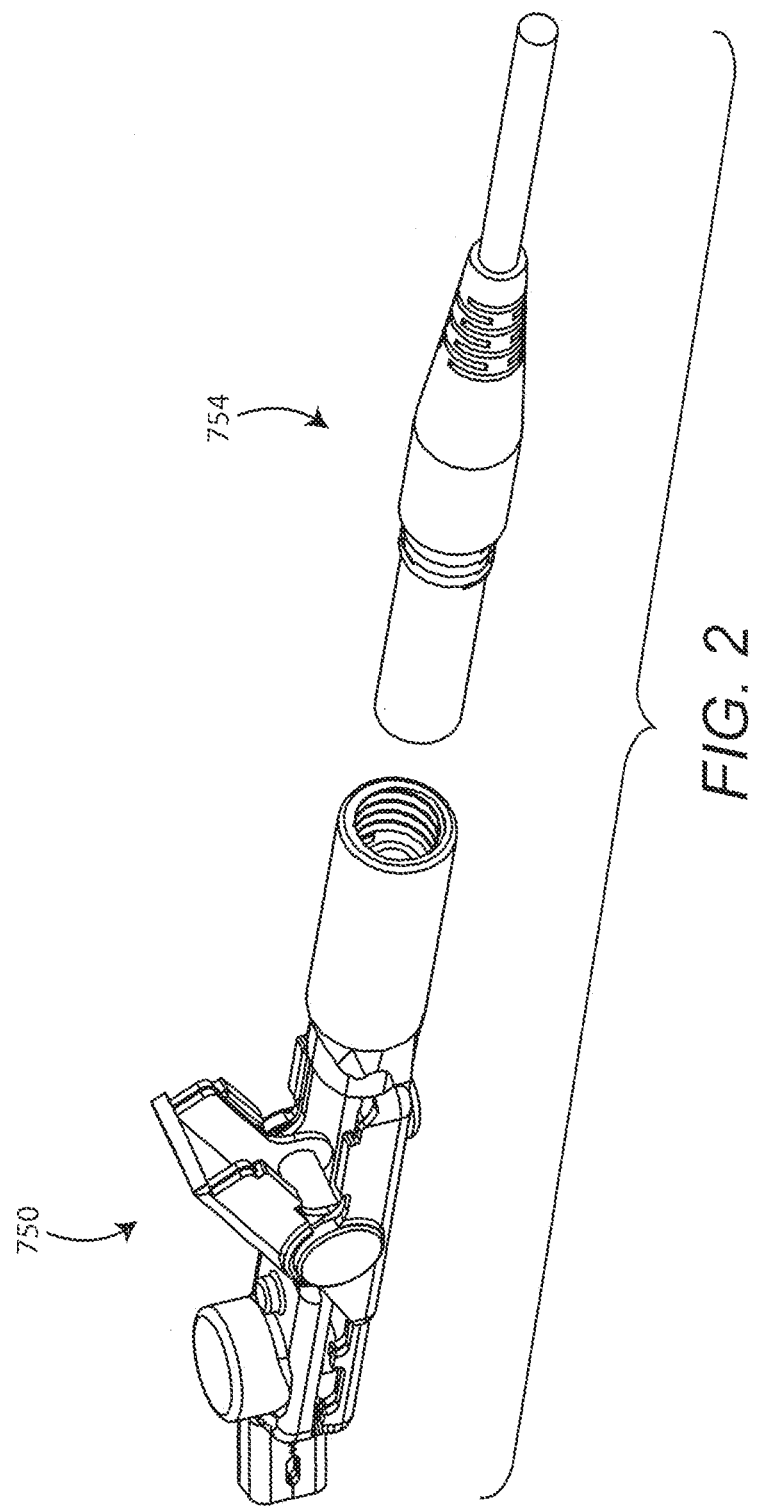
FIG. 2 is another perspective view of an insulated test clip assembly and test cable, in accordance with some implementations.
Figure 3:
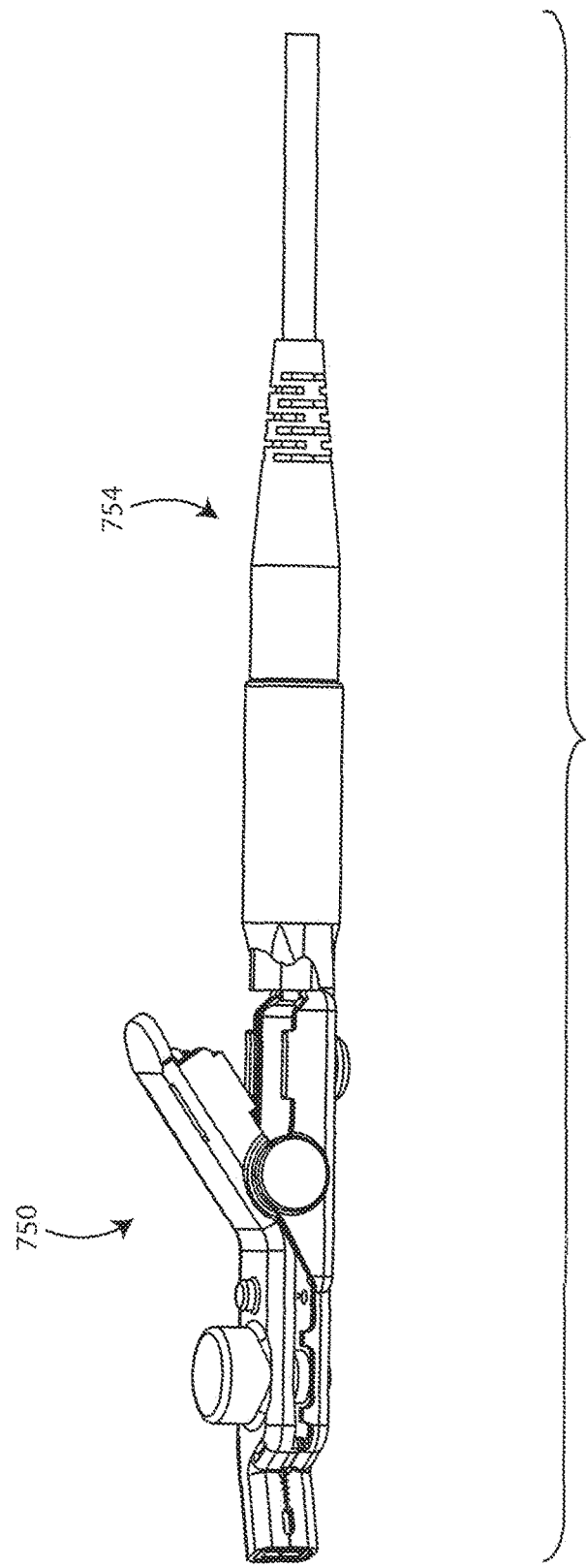
FIG. 3 is yet another perspective view of an insulated test clip assembly and test cable, in accordance with some implementations.

FIG. 2 is a perspective view of the insulated test clip assembly 750 and a test cable 754, in accordance with some implementations. FIG. 2 illustrates the test cable 754 decoupled from the insulated test clip assembly 750. FIG. 3 is another perspective view of the insulated test clip assembly 750 and the test cable 754, showing the test cable 754 coupled to the insulated test clip assembly 750.

Figure 4:
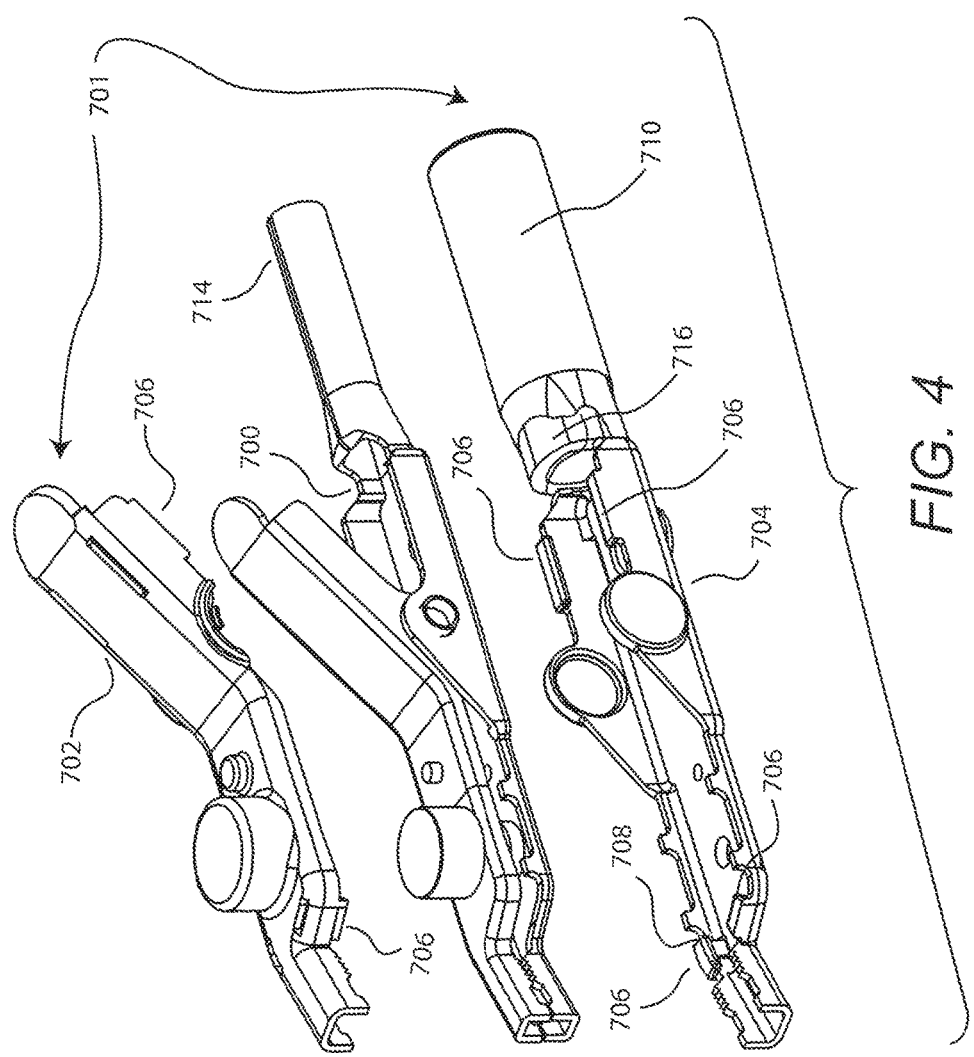
FIG. 4 is an exploded view of an insulated test clip, in accordance with some implementations.

FIG. 4 illustrates an exploded view of the insulated cover assembly 701 in conjunction with a test clip 700. In some implementations, the insulated cover assembly 701 comprises a first clip cover 702 and a second clip cover 704. The first clip cover 702 is configured to attach to a top portion of the test clip 700, and the second clip cover 704 is configured to attach to a bottom portion of the test clip 700. In some implementations, the first clip cover 702 and the second clip cover 704 include one or more retaining elements 706. In some implementations, the retaining elements 706 include a cantilevered segment 708 (or other surface, latch, snap, protrusion, or the like) that "snaps" over an edge of the test clip to removably attach the clip cover to the clip (e.g., by extending over the edge of the test clip to retain the cover to the clip). Retaining elements 706 may be situated at various places on the clip covers. For example, FIG. 4 illustrates the locations of some retaining elements 706 according to some implementations.

Figure 5:
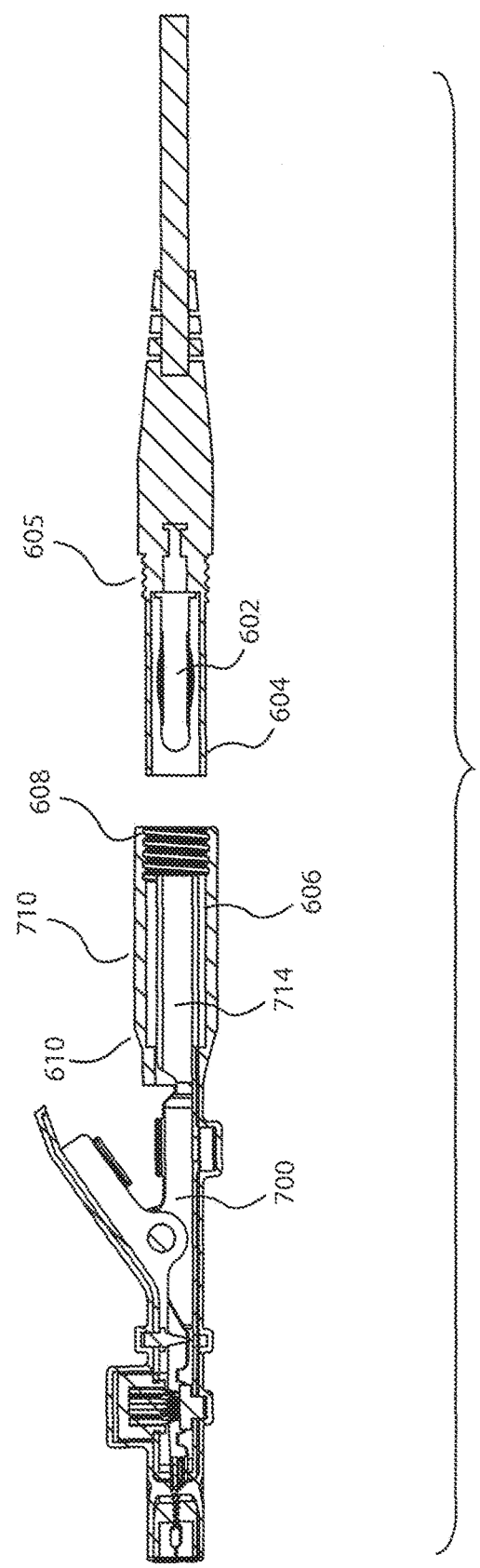
FIG. 5 is a sectional view of an insulated test clip and test cable, in accordance with some implementations.

In some implementations, the bottom portion of the test clip 700 includes a metal barrel 714. In some implementations, the metal barrel 714 is configured to electrically couple the test clip 700 to a cable, e.g., for connection to testing equipment. In some implementations, the metal barrel 714 is a female portion of a banana clip, and is configured to couple to a male portion of a banana clip. In some implementations, the second clip cover 704 includes an insulating sleeve 710 at one end that is configured to receive and cover the metal barrel. In some implementations, the inside diameter of the insulating sleeve 710 is larger than the outer diameter of the metal barrel 714. In some implementations, the inside diameter of the insulating sleeve 710 is larger than the outer diameter of a cover or shield that covers the male portion of a banana clip. FIG. 5 shows a cross-sectional view of a test clip 700, insulating cover assembly 701, a male portion of a banana clip 602, and a male banana-clip-cover 604. As shown in this figure, there is a gap 606 between the outer surface of the metal barrel 714 of the test clip and the inner surface of the insulating sleeve 710 into which the banana-clip-cover 604 is received when the banana clip is coupled to the test clip 700. FIG. 4 shows the test clip and the banana clip coupled together, according to some implementations.

In some implementations, the insulating sleeve 710 includes a threaded portion 608 on its inside surface for receiving a corresponding threaded portion 605 on the banana-clip-cover 604. In some implementations, the threaded portion is on the outside of the insulating cover assembly 701 and is configured to mate with a threaded portion on a banana-clip-cover (not shown).

In some implementations, the inside surface of the insulating sleeve 710 is configured to contact a portion of the metal barrel at an end opposite the mating opening of the barrel (e.g., at location 610, FIG. 5.) In some implementations, the inside surface is tapered near this location so as to contact a portion of the metal barrel 714 and/or a base of the metal barrel. The contact point between the metal barrel 714 and the insulating sleeve 710 can help stiffen the connection between the second clip cover 704 and the bottom clip portion (e.g., by squeezing or pressing against the outer surface of the metal barrel 714), and can provide extra structural integrity to the whole assembly. In some implementations, the second clip cover 704 includes a cut-out (cut-out 716, FIG. 4) along a portion of the insulating sleeve 710 to allow for easy insertion of the metal barrel 714 into the insulating sleeve 710 during assembly of the insulating cover assembly 701. For example, the cut-out allows the metal barrel 714 to be inserted initially at an angle so that the second clip cover 704 and the bottom portion of the test clip can be aligned with one another (e.g., in a fore-aft direction defined by the central axis of the metal barrel) to a greater degree before the second clip cover 704 is clipped to the bottom portion. In some implementations, the cut-out is positioned at or near location 610.

In some implementations, the insulating cover assembly 701 does not include the insulating sleeve 710. For example, in some implementations, the cover assembly 701 is configured for use with a test clip having a screw-down type electrical connection. Accordingly, the insulating sleeve 710 may be omitted, or may be configured to have a different size and/or shape so as to adequately cover and/or insulate the exposed metal of the screw-down type electrical connector.

Figure 6:
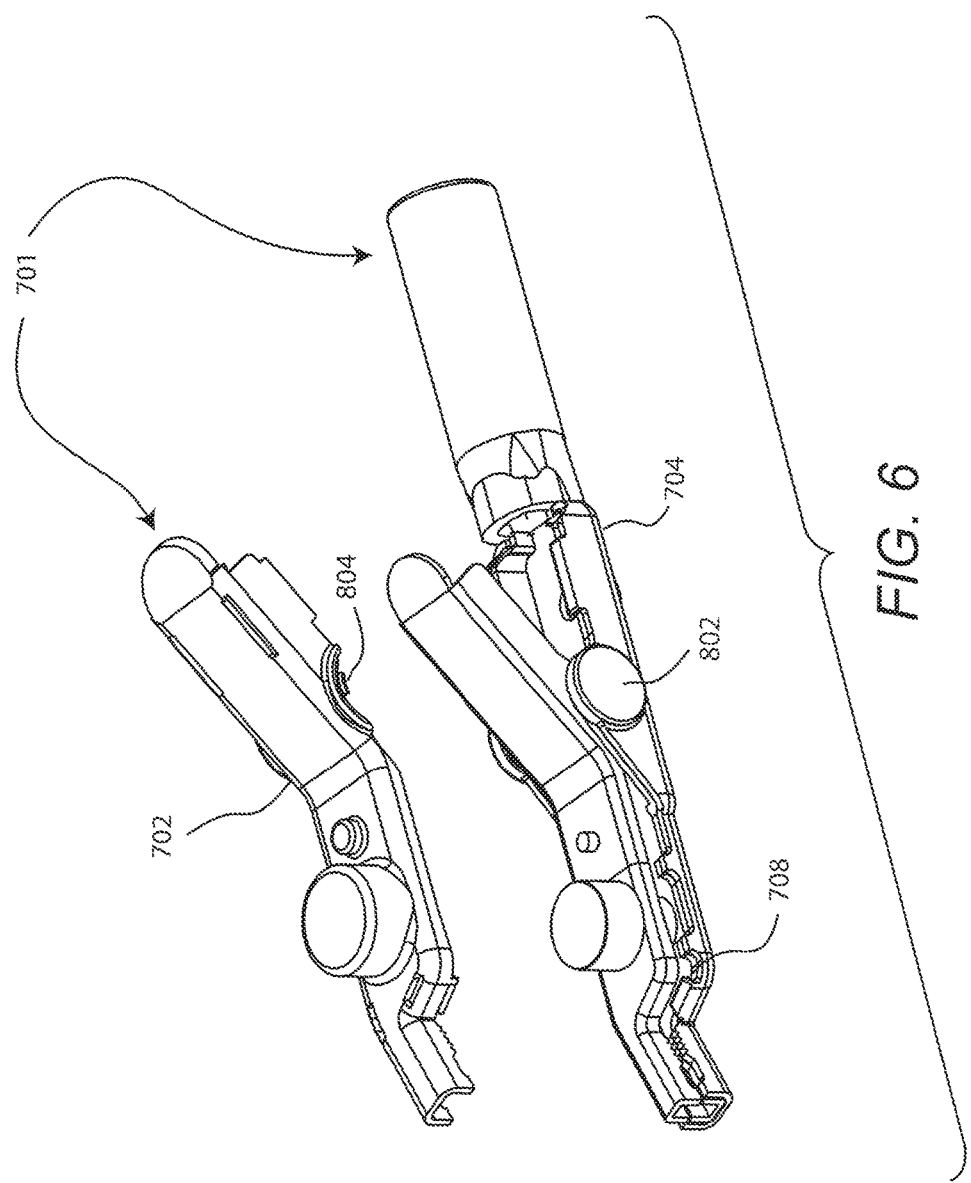
FIG. 6 is an exploded view of an insulating cover assembly, in accordance with some implementations.
Figure 7:
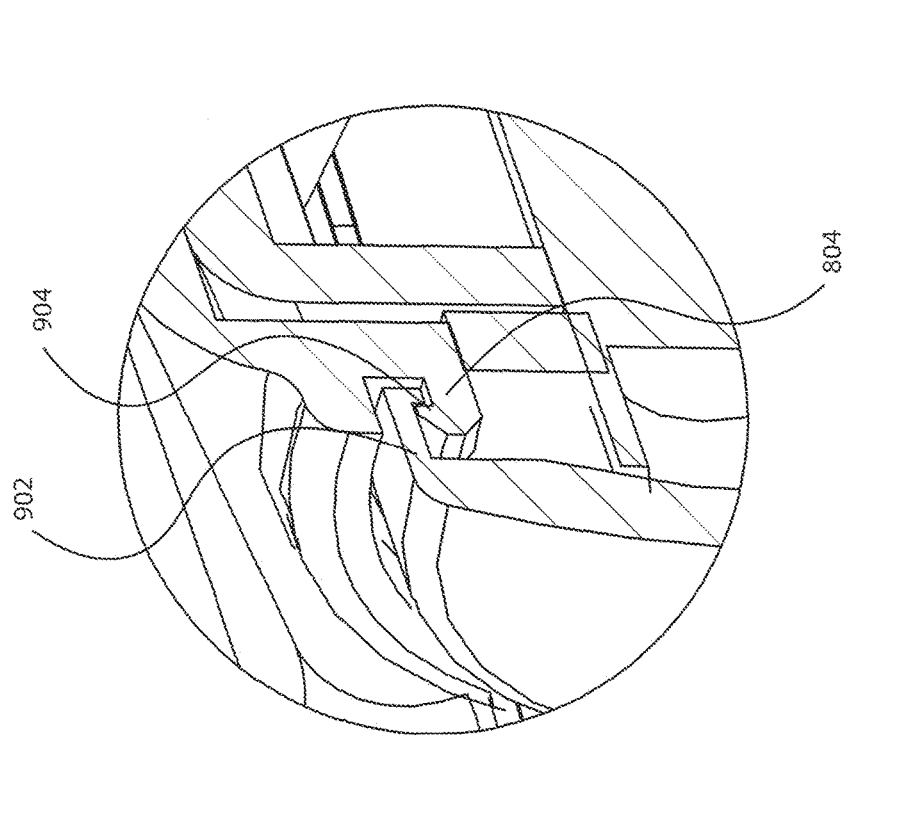
FIG. 7 is a sectional view of first and second clip covers of an insulating cover assembly, in accordance with some implementations.
Figure 8:
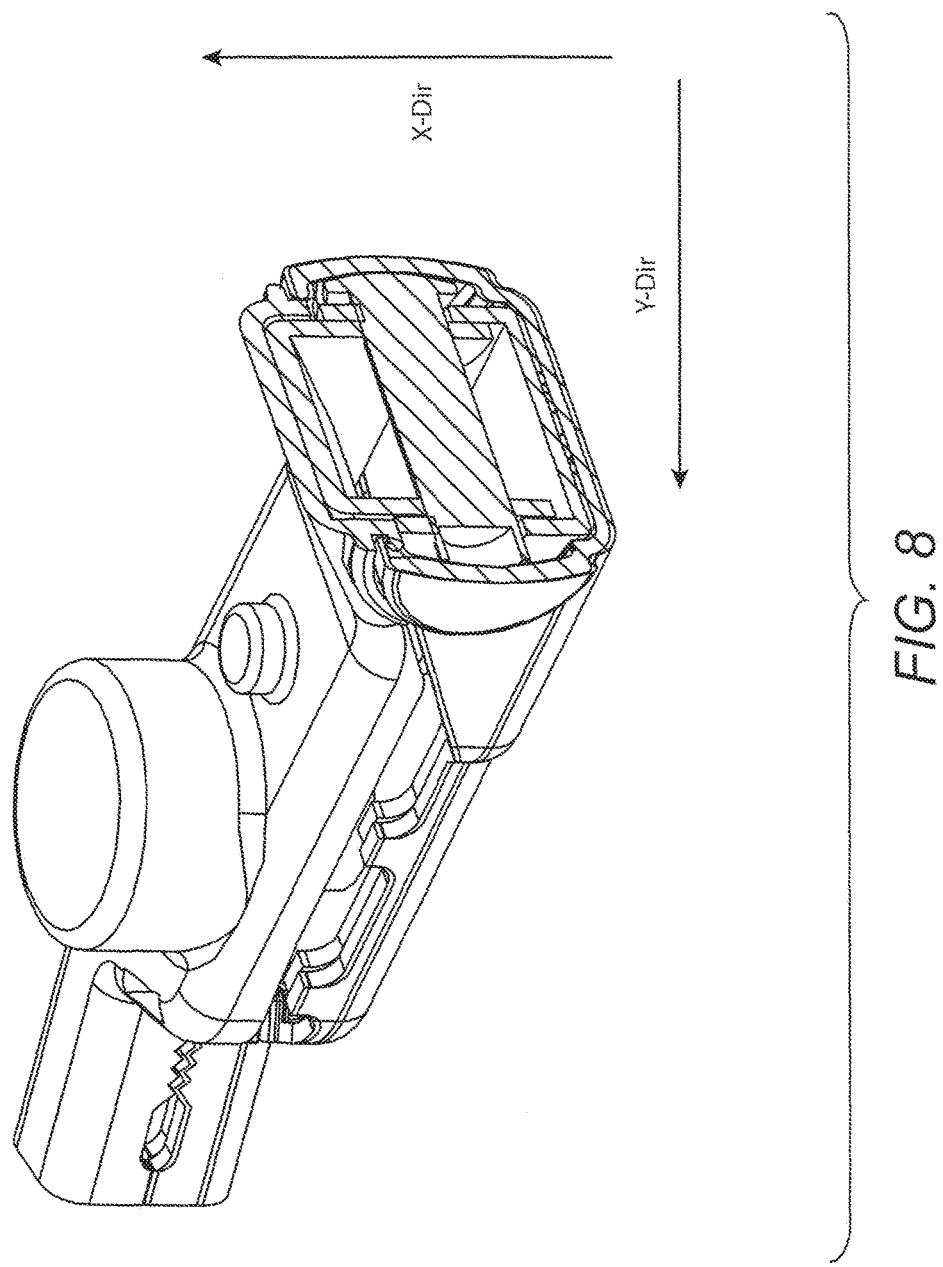
FIG. 8 is another sectional view of first and second clip covers of an insulating cover assembly, in accordance with some implementations.

FIGS. 6-8 illustrate a retaining mechanism for coupling the first clip cover to the second clip cover. For example, FIG. 6 is a partially exploded view of the insulating cover assembly 701 where the first clip cover 702 is shown removed from the top portion of the test clip. In some implementations, the second clip cover 704 includes a pivot shield 802 configured to substantially cover the test clip in area surrounding the pivot axis of the test clip. The first clip cover 702 includes a retaining lip 804, and the pivot shield 802 includes a retaining channel (channel 902, FIG. 7). The retaining lip 804 and the retaining channel are configured such that, when the first and the second clip covers are removably coupled to the test clip, the retaining channel receives the retaining lip 804 therein. With reference to FIG. 7, which is a sectional view of the first and second clip covers and the test clip, in some implementations, the retaining lip comprises a cantilevered segment 904 configured to contact an inner surface of the retaining channel so as to inhibit separation of the first clip cover and the second clip cover when the covers are coupled to each other and to the test clip. In some implementations, the retaining lip and retaining channel are configured such that they provide stiffness and structural integrity to the insulating assembly when assembled, but can still be snapped apart with a direct application of force to an appropriate location (e.g., by prying apart by hand, with a fingernail, screwdriver, or other tool) for ease of removal. In some implementations, the lip and channel are configured to require substantial force to separate (e.g., more than may be applied without tools), while in others, only minimal force is required.

FIG. 8 illustrates another sectional view of the first and second clip covers and the test clip, according to some implementations. In some implementations, the retaining lip and retaining channel operate to inhibit separation of the first and second clip covers both in a vertical direction (e.g., in the X direction identified in FIG. 8), as well as in a horizontal direction (e.g., in the Y direction identified in FIG. 8). In some implementations, the retaining lip is incorporated into the second clip cover 704 and the retaining channel is incorporated into the first clip cover 702. In some implementations, the pivot cover is incorporated into the first clip cover 702, or is comprised of portions of both the first clip cover 702 and the second clip cover 704. In some implementations, the retaining lip 804 and the retaining channel 902 are configured such that when the test clip is opened and closed (e.g., in response to application and removal of force to the grips of the test clip), the retaining lip glides and/or slides within the retaining channel to allow the first and the second clip covers to pivot with respect to one another along the pivot axis of the test clip.

In some implementations, cover assemblies 701 are provided in multiple different colors so that users can easily differentiate among multiple test clips and/or the test leads to which they are attached.

What is claimed is:

1. A test clip insulator, comprising:
    a first clip cover configured to removably attach to a top portion of a test clip, wherein the test clip comprises a top portion and a bottom portion pivotally attached to the top portion along a pivot axis; and
    a second clip cover configured to removably attach to the bottom portion of the test clip;
    wherein the each of the first and the second clip cover comprise retaining elements configured to secure the clip cover to its respective portion of the test clip said retaining elements configured to snap over an edge of said top portion of said test clip to retain said first clip cover to said top portion of said test clip, and said retaining elements configured to snap around an edge of said bottom portion of said test clip to retain said second clip cover to said bottom portion of said test clip.

2. The test clip insulator of claim 1, the first clip cover comprising:
    a surface insulating portion configured to be disposed along an outer surface of the top portion of the test clip, the outer surface of the test clip defining a plane that is substantially parallel to the pivot axis; and
    a side insulating portion configured to be disposed along a side surface of the top portion of the test clip.

3. The test clip insulator of claim 1, wherein the retaining elements extends along a plane that is substantially parallel to the surface insulating portion.

4. The test clip insulator of claim 1, wherein the retaining elements comprises a cantilevered segment configured to extend over a portion of the top portion of the test clip.

5. The test clip insulator of claim 1, the second clip cover comprising a jaw end and a connection end, the connection end comprising a barrel configured to receive and substantially surround the entire length of a banana clip receptacle.

6. The test clip insulator of claim 1, wherein the retaining elements are selected from the group consisting of: snaps; hooks; clips; pins and sockets; retaining rings; and snap rings.

7. The test clip insulator of claim 1, the second clip cover comprises a pivot shield configured to substantially cover the test clip in area surrounding the pivot axis when the second clip cover is removably coupled to the bottom portion of the test clip.

8. The test clip insulator of claim 7, wherein the first clip cover includes a retaining lip, and wherein the pivot shield comprises a retaining channel configured to receive the retaining lip when the first and the second clip covers are removably coupled to the test clip.

9. The test clip insulator of claim 8, wherein the retaining lip comprises a cantilevered segment configured to contact an inner surface of the retaining channel so as to inhibit separation of the first clip cover and the second clip cover.

10. A test clip insulator, comprising:
    a first clip cover configured to removably attach to a top portion of a test clip, wherein the test clip comprises a top portion and a bottom portion pivotally attached to the top portion along a pivot axis; and
    a second clip cover configured to removably attach to the bottom portion of the test clip;
    wherein the each of the first and the second clip cover comprises one or more cantilevered retaining segments configured to extend over a portion of the test clip in order to secure the first and the second clip covers to the test clip said cantilevered retaining segments configured to snap over an edge of said top portion of said test clip to retain said first clip cover to said top portion of said test clip, and said cantilevered retaining segments configured to snap around an edge of said bottom portion of said test clip to retain said second clip cover to said bottom portion of said test clip.

11. The test clip insulator of claim 10, wherein the second clip cover comprises a pivot shield configured to substantially cover the test clip in area surrounding the pivot axis when the second clip cover is removably coupled to the bottom portion of the test clip.

12. The test clip insulator of claim 11, wherein the first clip cover includes a retaining lip, and wherein the pivot shield comprises a retaining channel configured to receive the retaining lip when the first and the second clip covers are removably coupled to the test clip.

13. The test clip insulator of claim 12, wherein the retaining lip comprises a cantilevered segment configured to contact an inner surface of the retaining channel so as to inhibit separation of the first clip cover and the second clip cover.

14. An insulated test clip, comprising:
    a test clip, wherein the test clip comprises a top portion and a bottom portion pivotally attached to the top portion along a pivot axis;
    a first clip cover removably attached to the top portion of the test clip; and
    a second clip cover removably attached to the bottom portion of the test clip;

wherein the each of the first and the second clip cover comprises one or more cantilevered retaining segments extending over a portion of the test clip in order to secure the first and the second clip covers to the test clip said cantilevered retaining segments configured to snap over an edge of said top portion of said test clip to retain said first clip cover to said top portion of said test clip, and said cantilevered retaining segments configured to snap around an edge of said bottom portion of said test clip to retain said second clip cover to said bottom portion of said test clip.

15. The insulated test clip of claim 14, wherein the second clip cover comprises a pivot shield substantially covering the test clip in area surrounding the pivot axis.

16. The insulated test clip of claim 15, wherein the first clip cover includes a retaining lip, wherein the pivot shield comprises a retaining channel, and wherein the retaining lip is disposed within the retaining channel.

17. The insulated test clip of claim 16, wherein the retaining lip comprises a cantilevered segment in contact with an inner surface of the retaining channel so as to inhibit separation of the first clip cover and the second clip cover.

* * * * *